United States Patent
Wang et al.

(10) Patent No.: US 11,754,418 B2
(45) Date of Patent: Sep. 12, 2023

(54) ON-LINE WEB ACCESSED ENERGY METER

(71) Applicant: Electro Industries/Gauge Tech, Westbury, NY (US)

(72) Inventors: Wei Wang, Mahwah, NJ (US); Erran Kagan, Great Neck, NY (US)

(73) Assignee: EI ELECTRONICS LLC, Westbury, NY (US)

(*) Notice: Subject to any disclaimer, the term of this patent is extended or adjusted under 35 U.S.C. 154(b) by 0 days.

(21) Appl. No.: 16/824,741

(22) Filed: Mar. 20, 2020

(65) Prior Publication Data

US 2020/0217689 A1    Jul. 9, 2020

Related U.S. Application Data

(63) Continuation of application No. 14/093,644, filed on Dec. 2, 2013, now Pat. No. 10,641,618, which is a continuation of application No. 13/209,896, filed on Aug. 15, 2011, now Pat. No. 8,599,036, which is a continuation of application No. 11/998,920, filed on Dec. 3, 2007, now Pat. No. 7,999,696, which is a
(Continued)

(51) Int. Cl.
    *G01D 4/00*      (2006.01)
    *G01R 19/25*     (2006.01)
    *G06Q 50/06*     (2012.01)

(52) U.S. Cl.
    CPC ......... *G01D 4/002* (2013.01); *G01R 19/2513* (2013.01); *G06Q 50/06* (2013.01); *Y02B 90/20* (2013.01); *Y04S 20/30* (2013.01)

(58) Field of Classification Search
    CPC .... G01D 4/002; G01R 19/2513; G06Q 50/06; G01F 15/063
    See application file for complete search history.

(56) References Cited

U.S. PATENT DOCUMENTS

| | | |
|---|---|---|
| 1,863,741 A | 6/1932 | Leon |
| 2,292,163 A | 8/1942 | Shea |
| 2,435,753 A | 2/1948 | Walther et al. |

(Continued)

FOREIGN PATENT DOCUMENTS

| | | |
|---|---|---|
| EP | 2618228 A1 | 7/2013 |
| JP | 08247783 | 9/1996 |

(Continued)

OTHER PUBLICATIONS

European Standard EN-50160; "Voltage characteristics of electricity supplied by public distribution networks" Copyright 2007 CENELEC; published Oct. 31, 2007; pp. 1-23.
(Continued)

*Primary Examiner* — Albert K Wong
(74) *Attorney, Agent, or Firm* — Robinson + Cole LLP

(57) ABSTRACT

An electrical metering system capable of performing multiple metering functions, collecting data, and wirelessly provides the collected metering data to a utility operator. In the electrical metering system, at least one computing device for initiating a request for data. A first modem connects the computing device to an infrastructure. A wireless embedded modem for wirelessly connects an electric meter to an infrastructure, and the wireless electric modem receives a request from the computing device and wirelessly transmits the metering data to the computing device, thereby initiating the request.

18 Claims, 6 Drawing Sheets

Related U.S. Application Data continuation of application No. 10/969,706, filed on Oct. 20, 2004, now Pat. No. 7,304,586.

(56) References Cited

U.S. PATENT DOCUMENTS

| | | |
|---|---|---|
| 2,606,943 A | 8/1952 | Barker |
| 2,883,255 A | 4/1959 | Anderson |
| 2,900,605 A | 8/1959 | Squires et al. |
| 2,987,704 A | 6/1961 | Gimpel et al. |
| 2,992,365 A | 7/1961 | Brill |
| 3,084,863 A | 4/1963 | Du |
| 3,142,820 A | 7/1964 | Daniels |
| 3,166,726 A | 1/1965 | Jensen et al. |
| 3,205,439 A | 9/1965 | Michael et al. |
| 3,333,194 A | 7/1967 | Reynolds |
| 3,453,540 A | 7/1969 | Dusheck, Jr. |
| 3,458,810 A | 7/1969 | Wald |
| 3,467,864 A | 9/1969 | Plaats |
| 3,504,164 A | 3/1970 | Farrell et al. |
| 3,534,247 A | 10/1970 | Miljanic |
| 3,535,637 A | 10/1970 | Goransson |
| 3,629,852 A | 12/1971 | Thexton et al. |
| 3,737,891 A | 6/1973 | Metcalf |
| 3,815,013 A | 6/1974 | Milkovic |
| 3,824,441 A | 7/1974 | Heyman et al. |
| 3,995,210 A | 11/1976 | Milkovic |
| 4,066,960 A | 1/1978 | Milkovic |
| 4,077,061 A | 2/1978 | Johnston et al. |
| 4,140,952 A | 2/1979 | Miller |
| 4,158,810 A | 6/1979 | Leskovar |
| 4,182,983 A | 1/1980 | Heinrich et al. |
| 4,215,697 A | 8/1980 | Demetrescu |
| 4,240,149 A | 12/1980 | Fletcher et al. |
| 4,246,623 A | 1/1981 | Sun |
| 4,255,707 A | 3/1981 | Miller |
| 4,283,772 A | 8/1981 | Johnston |
| 4,336,736 A | 6/1982 | Mishima |
| 4,345,311 A | 8/1982 | Fielden |
| 4,360,879 A | 11/1982 | Cameron |
| 4,415,896 A | 11/1983 | Allgood |
| 4,437,059 A | 3/1984 | Hauptmann |
| 4,442,492 A | 4/1984 | Karlsson et al. |
| 4,463,311 A | 7/1984 | Kobayashi |
| 4,466,071 A | 8/1984 | Russell |
| 4,486,707 A | 12/1984 | Randall et al. |
| 4,495,463 A | 1/1985 | Milkovic |
| 4,608,533 A | 8/1986 | Starkie |
| 4,623,997 A | 11/1986 | Tulpule |
| 4,642,563 A | 2/1987 | McEachern et al. |
| 4,689,752 A | 8/1987 | Fernandes et al. |
| 4,709,339 A | 11/1987 | Fernandes |
| 4,713,608 A | 12/1987 | Catiller et al. |
| 4,713,609 A | 12/1987 | Losapio et al. |
| 4,742,296 A | 5/1988 | Petr et al. |
| 4,799,008 A | 1/1989 | Kannari |
| 4,804,957 A | 2/1989 | Selph et al. |
| 4,811,011 A | 3/1989 | Sollinger |
| 4,839,819 A | 6/1989 | Begin et al. |
| 4,841,236 A | 6/1989 | Miljanic et al. |
| 4,843,311 A | 6/1989 | Rozman et al. |
| 4,884,021 A | 11/1989 | Hammond et al. |
| 4,897,599 A | 1/1990 | Koslar |
| 4,902,965 A | 2/1990 | Bodrug et al. |
| 4,933,633 A | 6/1990 | Allgood |
| 4,949,029 A | 8/1990 | Cooper et al. |
| 4,958,294 A | 9/1990 | Herscher et al. |
| 4,958,640 A | 9/1990 | Logan |
| 4,979,122 A | 12/1990 | Davis et al. |
| 4,989,155 A | 1/1991 | Begin et al. |
| 4,996,646 A | 2/1991 | Farrington |
| 4,999,572 A | 3/1991 | Bickford et al. |
| 5,006,790 A | 4/1991 | Beverly et al. |
| 5,006,846 A | 4/1991 | Granville et al. |
| 5,014,229 A | 5/1991 | Mofachern |
| 5,017,860 A | 5/1991 | Germer et al. |
| 5,079,715 A | 1/1992 | Venkataraman et al. |
| 5,081,701 A | 1/1992 | Silver |
| 5,122,735 A | 6/1992 | Porter et al. |
| 5,132,609 A | 7/1992 | Nguyen |
| 5,132,610 A | 7/1992 | Ying-Chang |
| 5,166,887 A | 11/1992 | Farrington et al. |
| 5,170,115 A | 12/1992 | Kashiwabara et al. |
| 5,170,360 A | 12/1992 | Porter et al. |
| 5,185,705 A | 2/1993 | Farrington |
| 5,212,441 A | 5/1993 | McEachern et al. |
| 5,220,495 A | 6/1993 | Zulaski |
| 5,224,006 A | 6/1993 | MacKenzie et al. |
| 5,224,054 A | 6/1993 | Wallis |
| 5,226,120 A | 7/1993 | Brown et al. |
| 5,229,713 A | 7/1993 | Bullock et al. |
| 5,233,538 A | 8/1993 | Wallis |
| 5,237,511 A | 8/1993 | Caird et al. |
| 5,243,536 A | 9/1993 | Bradford |
| 5,245,275 A | 9/1993 | Germer et al. |
| 5,248,935 A | 9/1993 | Sakoyama et al. |
| 5,248,967 A | 9/1993 | Daneshfar |
| 5,258,704 A | 11/1993 | Germer et al. |
| 5,289,115 A | 2/1994 | Germer et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,121 A | 4/1994 | Garverick et al. |
| 5,302,890 A | 4/1994 | McEachern et al. |
| 5,307,009 A | 4/1994 | McEachern et al. |
| 5,315,527 A | 5/1994 | Beckwith |
| 5,325,051 A | 6/1994 | Germer et al. |
| 5,343,143 A | 8/1994 | Voisine et al. |
| 5,347,464 A | 9/1994 | McEachern et al. |
| 5,391,983 A | 2/1995 | Lusignan et al. |
| 5,402,148 A | 3/1995 | Post et al. |
| 5,406,495 A | 4/1995 | Hill |
| 5,438,257 A | 8/1995 | Berkcan |
| 5,442,279 A | 8/1995 | Kitayoshi et al. |
| 5,450,007 A | 9/1995 | Payne et al. |
| 5,453,697 A | 9/1995 | Schweer et al. |
| 5,459,395 A | 10/1995 | Berkcan |
| 5,459,459 A | 10/1995 | Lee, Jr. |
| 5,475,628 A | 12/1995 | Adams et al. |
| 5,514,958 A | 5/1996 | Germer |
| 5,528,507 A | 6/1996 | McNamara et al. |
| 5,537,340 A | 7/1996 | Gawlik |
| 5,544,064 A | 8/1996 | Beckwith |
| 5,548,527 A | 8/1996 | Hemminger et al. |
| 5,555,508 A | 9/1996 | Munday et al. |
| 5,559,719 A | 9/1996 | Johnson et al. |
| 5,563,506 A | 10/1996 | Fielden et al. |
| 5,568,047 A | 10/1996 | Staver et al. |
| 5,572,438 A | 11/1996 | Ehlers et al. |
| 5,574,654 A | 11/1996 | Bingham et al. |
| 5,581,173 A | 12/1996 | Yalla et al. |
| 5,592,165 A | 1/1997 | Jackson et al. |
| 5,606,510 A | 2/1997 | Glaser et al. |
| 5,619,142 A | 4/1997 | Schweer et al. |
| 5,627,759 A | 5/1997 | Bearden et al. |
| 5,642,300 A | 6/1997 | Gubisch et al. |
| 5,650,936 A | 7/1997 | Loucks et al. |
| 5,675,754 A * | 10/1997 | King .............. G01R 19/2513 715/823 |
| 5,706,204 A | 1/1998 | Cox et al. |
| 5,706,214 A | 1/1998 | Putt et al. |
| 5,734,571 A | 3/1998 | Pilz et al. |
| 5,736,847 A | 4/1998 | Van Doorn et al. |
| 5,737,231 A | 4/1998 | Pyle et al. |
| 5,757,357 A | 5/1998 | Grande et al. |
| 5,758,331 A | 5/1998 | Johnson |
| 5,764,523 A | 6/1998 | Yoshinaga et al. |
| 5,768,632 A | 6/1998 | Husted et al. |
| 5,774,366 A | 6/1998 | Beckwith |
| 5,801,643 A | 9/1998 | Williams et al. |
| 5,819,203 A | 10/1998 | Moore et al. |

(56) References Cited

U.S. PATENT DOCUMENTS

| | | |
|---|---|---|
| 5,822,165 A | 10/1998 | Moran |
| 5,825,656 A | 10/1998 | Moore et al. |
| 5,828,576 A | 10/1998 | Loucks et al. |
| 5,832,210 A | 11/1998 | Akiyama et al. |
| 5,862,391 A | 1/1999 | Salas et al. |
| 5,874,903 A | 2/1999 | Shuey et al. |
| 5,890,097 A | 3/1999 | Cox |
| 5,892,758 A | 4/1999 | Argyroudis |
| 5,896,547 A | 4/1999 | Lee |
| 5,897,607 A | 4/1999 | Jenney et al. |
| 5,898,387 A | 4/1999 | Davis et al. |
| 5,899,960 A | 5/1999 | Moore et al. |
| 5,907,238 A | 5/1999 | Owerko et al. |
| 5,933,029 A | 8/1999 | Kuroda et al. |
| 5,952,819 A | 9/1999 | Berkcan et al. |
| 5,963,734 A | 10/1999 | Ackerman et al. |
| 5,978,655 A | 11/1999 | Ohura et al. |
| 5,986,574 A | 11/1999 | Colton |
| 5,994,892 A * | 11/1999 | Turino ................. G01F 15/063 324/142 |
| 5,995,911 A | 11/1999 | Hart |
| 6,000,034 A | 12/1999 | Lightbody et al. |
| 6,005,759 A | 12/1999 | Hart et al. |
| 6,011,519 A | 1/2000 | Sadler et al. |
| 6,018,690 A | 1/2000 | Saito et al. |
| 6,018,700 A | 1/2000 | Edel |
| 6,023,160 A | 2/2000 | Coburn |
| 6,032,109 A | 2/2000 | Ritmiller, III |
| 6,038,516 A | 3/2000 | Alexander et al. |
| 6,041,257 A | 3/2000 | MacDuff et al. |
| 6,064,192 A | 5/2000 | Redmyer |
| 6,073,169 A | 6/2000 | Shuey et al. |
| 6,098,175 A | 8/2000 | Lee |
| 6,100,817 A | 8/2000 | Mason, Jr. et al. |
| 6,112,136 A | 8/2000 | Paul et al. |
| 6,133,720 A | 10/2000 | Elmore |
| 6,157,329 A | 12/2000 | Lee et al. |
| 6,163,243 A | 12/2000 | Titus |
| 6,167,329 A | 12/2000 | Engel et al. |
| 6,185,508 B1 | 2/2001 | Van Doorn et al. |
| 6,186,842 B1 | 2/2001 | Hirschbold et al. |
| 6,195,614 B1 | 2/2001 | Kochan |
| 6,236,949 B1 | 5/2001 | Hart |
| 6,262,672 B1 | 7/2001 | Brooksby et al. |
| 6,269,316 B1 | 7/2001 | Hubbard et al. |
| 6,289,267 B1 | 9/2001 | Alexander et al. |
| 6,292,717 B1 | 9/2001 | Alexander et al. |
| 6,301,527 B1 | 10/2001 | Butland et al. |
| 6,363,057 B1 | 3/2002 | Ardalan et al. |
| 6,374,084 B1 | 4/2002 | Fok |
| 6,396,421 B1 | 5/2002 | Bland |
| 6,396,839 B1 | 5/2002 | Ardalan et al. |
| 6,397,155 B1 | 5/2002 | Przydatek et al. |
| 6,401,054 B1 | 6/2002 | Andersen |
| 6,415,244 B1 | 7/2002 | Dickens et al. |
| 6,417,661 B1 | 7/2002 | Berkcan et al. |
| 6,418,450 B2 | 7/2002 | Daudenarde |
| 6,423,960 B1 | 7/2002 | Engelhardt et al. |
| 6,429,637 B1 | 8/2002 | Gandhi |
| 6,429,785 B1 | 8/2002 | Griffin et al. |
| 6,433,981 B1 | 8/2002 | Fletcher et al. |
| 6,437,692 B1 | 8/2002 | Petite et al. |
| 6,438,651 B1 | 8/2002 | Slane |
| 6,444,971 B1 | 9/2002 | Engelhardt et al. |
| 6,479,976 B1 | 11/2002 | Edel |
| 6,483,291 B1 | 11/2002 | Bhateja et al. |
| 6,493,644 B1 | 12/2002 | Jonker et al. |
| 6,509,850 B1 | 1/2003 | Bland |
| 6,519,537 B1 | 2/2003 | Yang |
| 6,522,517 B1 | 2/2003 | Edel |
| 6,526,581 B1 | 2/2003 | Edson |
| 6,528,957 B1 | 3/2003 | Luchaco |
| 6,538,577 B1 | 3/2003 | Ehrke et al. |
| 6,542,838 B1 | 4/2003 | Haddad et al. |
| 6,553,418 B1 | 4/2003 | Collins et al. |
| 6,563,697 B1 | 5/2003 | Simbeck et al. |
| 6,577,642 B1 | 6/2003 | Fijolek et al. |
| 6,590,380 B2 | 7/2003 | Edel |
| 6,611,773 B2 | 8/2003 | Przydatek et al. |
| 6,611,922 B2 | 8/2003 | Ozcetin et al. |
| 6,615,147 B1 | 9/2003 | Jonker et al. |
| 6,621,433 B1 | 9/2003 | Hertz |
| 6,636,030 B1 | 10/2003 | Rose et al. |
| 6,639,538 B1 | 10/2003 | Sechi et al. |
| 6,657,552 B2 | 12/2003 | Belski et al. |
| 6,661,357 B2 | 12/2003 | Bland |
| 6,671,635 B1 | 12/2003 | Forth et al. |
| 6,671,654 B1 | 12/2003 | Forth et al. |
| 6,671,802 B1 | 12/2003 | Ott |
| 6,674,379 B1 | 1/2004 | Li et al. |
| 6,675,071 B1 | 1/2004 | Griffin, Jr. et al. |
| 6,687,627 B1 | 2/2004 | Gunn et al. |
| 6,694,270 B2 | 2/2004 | Hart |
| 6,701,264 B2 | 3/2004 | Caso et al. |
| 6,714,881 B2 | 3/2004 | Carlson et al. |
| 6,717,394 B2 | 4/2004 | Elms |
| 6,732,124 B1 | 5/2004 | Koseki et al. |
| 6,735,535 B1 | 5/2004 | Kagan et al. |
| 6,737,855 B2 | 5/2004 | Huber et al. |
| 6,745,138 B2 | 6/2004 | Przydatek et al. |
| 6,751,562 B1 | 6/2004 | Blackett et al. |
| 6,751,563 B2 | 6/2004 | Spanier et al. |
| 6,757,628 B1 | 6/2004 | Anderson et al. |
| 6,759,837 B2 | 7/2004 | Gandhi |
| 6,762,675 B1 | 7/2004 | Cafiero et al. |
| 6,792,337 B2 | 9/2004 | Blackett et al. |
| 6,792,364 B2 | 9/2004 | Jonker et al. |
| 6,798,190 B2 | 9/2004 | Harding et al. |
| 6,798,191 B1 | 9/2004 | Macfarlane et al. |
| 6,801,865 B2 | 10/2004 | Gilgenbach et al. |
| 6,813,571 B2 | 11/2004 | Lightbody et al. |
| 6,817,890 B1 | 11/2004 | Schindler |
| 6,825,776 B2 | 11/2004 | Lightbody et al. |
| 6,829,267 B2 | 12/2004 | Vaughan et al. |
| 6,836,737 B2 | 12/2004 | Petite et al. |
| 6,842,707 B2 | 1/2005 | Raichle et al. |
| 6,853,978 B2 | 2/2005 | Forth et al. |
| 6,871,150 B2 | 3/2005 | Huber et al. |
| 6,894,979 B1 | 5/2005 | Lee |
| 6,900,738 B2 | 5/2005 | Crichlow |
| 6,917,888 B2 | 7/2005 | Logvinov et al. |
| 6,934,754 B2 | 8/2005 | West et al. |
| 6,944,555 B2 | 9/2005 | Blackett et al. |
| 6,957,158 B1 | 10/2005 | Hancock et al. |
| 6,957,275 B1 | 10/2005 | Sekiguchi |
| 6,961,641 B1 | 11/2005 | Forth et al. |
| 6,963,195 B1 | 11/2005 | Berkcan |
| 6,972,364 B2 | 12/2005 | Diedrichsen |
| 6,975,209 B2 | 12/2005 | Gromov |
| 6,983,211 B2 | 1/2006 | Macfarlene et al. |
| 6,985,087 B2 | 1/2006 | Soliman |
| 6,988,025 B2 | 1/2006 | Ransom et al. |
| 6,988,043 B1 | 1/2006 | Randall |
| 6,988,182 B2 | 1/2006 | Teachman et al. |
| 6,989,735 B2 | 1/2006 | Fisher et al. |
| 6,990,395 B2 | 1/2006 | Ransom et al. |
| 7,006,934 B2 | 2/2006 | Jonker et al. |
| 7,010,438 B2 | 3/2006 | Hancock et al. |
| 7,035,593 B2 | 4/2006 | Miller et al. |
| 7,043,459 B2 | 5/2006 | Peevey |
| 7,047,216 B2 | 5/2006 | Kashti |
| 7,049,975 B2 | 5/2006 | Vanderah et al. |
| 7,050,808 B2 | 5/2006 | Janusz et al. |
| 7,050,916 B2 | 5/2006 | Curtis et al. |
| 7,072,779 B2 | 7/2006 | Hancock et al. |
| 7,085,824 B2 | 8/2006 | Forth et al. |
| 7,085,938 B1 | 8/2006 | Pozzuoli et al. |
| 7,089,089 B2 | 8/2006 | Cumming et al. |
| 7,126,439 B2 | 10/2006 | Qi et al. |
| 7,126,493 B2 | 10/2006 | Junker et al. |
| 7,127,328 B2 | 10/2006 | Ransom |
| 7,135,956 B2 | 11/2006 | Bartone et al. |
| 7,136,384 B1 | 11/2006 | Wang |
| 7,155,350 B2 | 12/2006 | Kagan |

(56) References Cited

U.S. PATENT DOCUMENTS

| | | |
|---|---|---|
| 7,158,050 B2 | 1/2007 | Lightbody et al. |
| 7,171,467 B2 | 1/2007 | Carley |
| 7,174,258 B2 | 2/2007 | Hart |
| 7,174,261 B2 | 2/2007 | Gunn et al. |
| 7,188,003 B2 | 3/2007 | Ransom et al. |
| 7,191,076 B2 | 3/2007 | Huber et al. |
| 7,196,673 B2 | 3/2007 | Savage et al. |
| 7,203,736 B1 | 4/2007 | Burnett et al. |
| 7,209,804 B2 | 4/2007 | Curt et al. |
| 7,216,043 B2 | 5/2007 | Ransom et al. |
| 7,239,184 B2 | 7/2007 | Cetrulo et al. |
| 7,243,050 B2 | 7/2007 | Armstrong |
| 7,246,014 B2 | 7/2007 | Forth et al. |
| 7,248,977 B2 | 7/2007 | Hart |
| 7,248,978 B2 | 7/2007 | Ransom |
| 7,249,265 B2 | 7/2007 | Carolsfeld et al. |
| 7,256,709 B2 | 8/2007 | Kagan |
| 7,257,107 B2 | 8/2007 | Swier, Jr. et al. |
| 7,271,996 B2 | 9/2007 | Kagan et al. |
| 7,294,997 B2 | 11/2007 | Kagan |
| 7,304,586 B2 | 12/2007 | Wang et al. |
| 7,304,829 B2 | 12/2007 | Nadipuram et al. |
| 7,305,310 B2 | 12/2007 | Slota et al. |
| 7,313,176 B1 | 12/2007 | Groen |
| 7,337,081 B1 | 2/2008 | Kagan |
| 7,342,507 B2 | 3/2008 | Jonker et al. |
| 7,346,786 B1 | 3/2008 | Dimick et al. |
| 7,359,809 B2 | 4/2008 | Bruno |
| 7,369,950 B2 | 5/2008 | Wall et al. |
| 7,372,574 B2 | 5/2008 | Sanders et al. |
| 7,379,997 B2 | 5/2008 | Ehlers et al. |
| 7,395,323 B2 | 7/2008 | Larson et al. |
| 7,409,303 B2 | 8/2008 | Yeo et al. |
| 7,415,368 B2 | 8/2008 | Gilbert et al. |
| 7,436,687 B2 | 10/2008 | Patel |
| 7,444,454 B2 | 10/2008 | Yancey et al. |
| 7,447,760 B2 | 11/2008 | Forth et al. |
| 7,447,762 B2 | 11/2008 | Curray et al. |
| 7,486,624 B2 | 2/2009 | Shaw et al. |
| 7,511,468 B2 | 3/2009 | McEachern et al. |
| 7,514,907 B2 | 4/2009 | Rajda et al. |
| 7,554,320 B2 | 6/2009 | Kagan |
| 7,577,542 B2 | 8/2009 | Vacar et al. |
| 7,616,656 B2 | 11/2009 | Wang et al. |
| 7,630,863 B2 | 12/2009 | Zweigle et al. |
| 7,660,682 B2 | 2/2010 | Slota et al. |
| 7,761,910 B2 | 7/2010 | Ransom et al. |
| 7,765,127 B2 | 7/2010 | Banks et al. |
| 7,877,169 B2 | 1/2011 | Slota et al. |
| 7,881,907 B2 | 2/2011 | Curt et al. |
| 7,899,630 B2 | 3/2011 | Kagan |
| 7,916,060 B2 | 3/2011 | Zhu et al. |
| 7,920,976 B2 | 4/2011 | Banhegyesi |
| 7,953,899 B1 | 5/2011 | Hooper |
| 7,962,298 B2 | 6/2011 | Przydatek et al. |
| 7,974,713 B2 | 7/2011 | Disch et al. |
| 7,996,171 B2 | 8/2011 | Banhegyesi |
| 7,999,696 B2 | 8/2011 | Wang et al. |
| 8,022,690 B2 | 9/2011 | Kagan |
| 8,037,173 B2 | 10/2011 | Tuckey et al. |
| 8,063,704 B2 | 11/2011 | Wu et al. |
| 8,073,642 B2 | 12/2011 | Slota et al. |
| 8,078,418 B2 | 12/2011 | Banhegyesi et al. |
| 8,107,491 B2 | 1/2012 | Wang et al. |
| 8,121,801 B2 | 2/2012 | Spanier et al. |
| 8,160,824 B2 | 4/2012 | Spanier et al. |
| 8,190,381 B2 | 5/2012 | Spanier et al. |
| 8,269,482 B2 | 9/2012 | Banhegyesi |
| 8,442,660 B2 | 5/2013 | Kagan |
| 8,515,348 B2 | 8/2013 | Kagan |
| 8,599,036 B2 | 12/2013 | Wang et al. |
| 8,620,608 B2 | 12/2013 | Banhegyesi et al. |
| 8,666,688 B2 | 3/2014 | Spanier et al. |
| 8,700,347 B2 | 4/2014 | Spanier et al. |
| 8,797,202 B2 | 8/2014 | Zhu et al. |
| 8,862,435 B2 | 10/2014 | Spanier et al. |
| 8,878,517 B2 | 11/2014 | Banhegyesi |
| 8,930,153 B2 | 1/2015 | Kagan et al. |
| 8,933,815 B2 | 1/2015 | Kagan et al. |
| 9,080,894 B2 | 7/2015 | Spanier et al. |
| 9,092,593 B2 | 7/2015 | Nasle |
| 9,194,898 B2 | 11/2015 | Banhegyesi et al. |
| 9,482,555 B2 | 11/2016 | Spanier et al. |
| 9,696,180 B2 | 7/2017 | Kagan |
| 9,897,665 B2 | 2/2018 | Taft |
| 9,903,895 B2 | 2/2018 | Banhegyesi et al. |
| 9,989,618 B2 | 6/2018 | Spanier et al. |
| 2001/0038343 A1 | 11/2001 | Meyer et al. |
| 2001/0038689 A1 | 11/2001 | Liljestrand et al. |
| 2002/0014884 A1 | 2/2002 | Chung |
| 2002/0018399 A1 | 2/2002 | Schultz et al. |
| 2002/0026957 A1 | 3/2002 | Reyman |
| 2002/0032535 A1 | 3/2002 | Alexander et al. |
| 2002/0048269 A1 | 4/2002 | Hong et al. |
| 2002/0072868 A1 | 6/2002 | Bartone et al. |
| 2002/0073211 A1 | 6/2002 | Lin et al. |
| 2002/0091784 A1 | 7/2002 | Baker et al. |
| 2002/0105435 A1 | 8/2002 | Yee et al. |
| 2002/0109608 A1 | 8/2002 | Petite et al. |
| 2002/0114326 A1 | 8/2002 | Mahalingaiah |
| 2002/0120723 A1 | 8/2002 | Forth et al. |
| 2002/0129342 A1 | 9/2002 | Kil et al. |
| 2002/0161536 A1 | 10/2002 | Suh et al. |
| 2002/0162014 A1 | 10/2002 | Przydatek et al. |
| 2002/0165677 A1 | 11/2002 | Lightbody et al. |
| 2002/0169570 A1 | 11/2002 | Spanier et al. |
| 2002/0173927 A1 | 11/2002 | Vandiver |
| 2002/0180420 A1 | 12/2002 | Lavoie et al. |
| 2003/0009401 A1 | 1/2003 | Ellis |
| 2003/0014200 A1 | 1/2003 | Jonker et al. |
| 2003/0018982 A1 | 1/2003 | Zeidler et al. |
| 2003/0025620 A1 | 2/2003 | Bland |
| 2003/0065459 A1 | 4/2003 | Huber et al. |
| 2003/0076247 A1 | 4/2003 | Bland |
| 2003/0084112 A1 | 5/2003 | Curray et al. |
| 2003/0093429 A1 | 5/2003 | Nishikawa et al. |
| 2003/0101008 A1 | 5/2003 | Hart |
| 2003/0105608 A1 | 6/2003 | Hart |
| 2003/0132742 A1 | 7/2003 | Harding et al. |
| 2003/0154471 A1 | 8/2003 | Teachman et al. |
| 2003/0176952 A1 | 9/2003 | Collins et al. |
| 2003/0178982 A1 | 9/2003 | Elms |
| 2003/0178985 A1 | 9/2003 | Briese et al. |
| 2003/0185110 A1 | 10/2003 | Fujisawa |
| 2003/0187550 A1 | 10/2003 | Wilson et al. |
| 2003/0204756 A1 | 10/2003 | Ransom et al. |
| 2003/0210699 A1 | 11/2003 | Holt et al. |
| 2003/0212512 A1 | 11/2003 | Hart |
| 2003/0220752 A1 | 11/2003 | Hart |
| 2003/0226058 A1 | 12/2003 | Miller et al. |
| 2004/0049524 A1 | 3/2004 | Toyota et al. |
| 2004/0064198 A1 | 4/2004 | Reynolds et al. |
| 2004/0066311 A1 | 4/2004 | Giles et al. |
| 2004/0078474 A1 | 4/2004 | Ramaswamy |
| 2004/0083066 A1 | 4/2004 | Hayes et al. |
| 2004/0113810 A1 | 6/2004 | Mason et al. |
| 2004/0122833 A1 | 6/2004 | Forth et al. |
| 2004/0128260 A1 | 7/2004 | Amedure et al. |
| 2004/0138786 A1 | 7/2004 | Blackett et al. |
| 2004/0138787 A1 | 7/2004 | Ransom et al. |
| 2004/0138835 A1 | 7/2004 | Ransom et al. |
| 2004/0153594 A1 | 8/2004 | Rotvold et al. |
| 2004/0167686 A1 | 8/2004 | Baker et al. |
| 2004/0172207 A1 | 9/2004 | Hancock et al. |
| 2004/0177062 A1 | 9/2004 | Urquhart et al. |
| 2004/0183522 A1 | 9/2004 | Gunn et al. |
| 2004/0193329 A1 | 9/2004 | Ransom et al. |
| 2004/0208182 A1 | 10/2004 | Boles et al. |
| 2004/0229578 A1 | 11/2004 | Lightbody et al. |
| 2005/0017874 A1 | 1/2005 | Lightbody et al. |
| 2005/0021252 A1 | 1/2005 | Hui |
| 2005/0027464 A1 | 2/2005 | Jonker et al. |
| 2005/0039040 A1 | 2/2005 | Ransom et al. |
| 2005/0060110 A1 | 3/2005 | Jones et al. |

(56) References Cited

U.S. PATENT DOCUMENTS

| | | |
|---|---|---|
| 2005/0071106 A1 | 3/2005 | Huber et al. |
| 2005/0093571 A1 | 5/2005 | Suaris et al. |
| 2005/0144437 A1 | 6/2005 | Ransom et al. |
| 2005/0165585 A1 | 7/2005 | Bhateja et al. |
| 2005/0187725 A1 | 8/2005 | Cox |
| 2005/0220079 A1 | 10/2005 | Asokan |
| 2005/0240362 A1 | 10/2005 | Randall |
| 2005/0243204 A1 | 11/2005 | Zhu |
| 2005/0273183 A1 | 12/2005 | Curt et al. |
| 2005/0273280 A1 | 12/2005 | Cox |
| 2005/0275397 A1 | 12/2005 | Lightbody et al. |
| 2005/0288876 A1 | 12/2005 | Doig et al. |
| 2005/0288877 A1 | 12/2005 | Doig et al. |
| 2006/0020405 A1 | 1/2006 | Kagan |
| 2006/0020634 A1 | 1/2006 | Huras et al. |
| 2006/0047787 A1 | 3/2006 | Agarwal et al. |
| 2006/0049694 A1 | 3/2006 | Kates |
| 2006/0052958 A1 | 3/2006 | Hancock et al. |
| 2006/0066456 A1 | 3/2006 | Jonker et al. |
| 2006/0066903 A1 | 3/2006 | Shiimori |
| 2006/0077999 A1 | 4/2006 | Kagan et al. |
| 2006/0083260 A1 | 4/2006 | Wang et al. |
| 2006/0085419 A1 | 4/2006 | Rosen |
| 2006/0086893 A1 | 4/2006 | Spanier et al. |
| 2006/0095219 A1 | 5/2006 | Bruno |
| 2006/0116842 A1 | 6/2006 | Tarantola et al. |
| 2006/0145890 A1 | 7/2006 | Junker et al. |
| 2006/0161360 A1 | 7/2006 | Yao et al. |
| 2006/0161400 A1 | 7/2006 | Kagan |
| 2006/0170409 A1 | 8/2006 | Kagan et al. |
| 2006/0187956 A1 | 8/2006 | Doviak et al. |
| 2006/0200599 A1 | 9/2006 | Manchester et al. |
| 2006/0224336 A1 | 10/2006 | Petras et al. |
| 2006/0230394 A1 | 10/2006 | Forth et al. |
| 2006/0261296 A1 | 11/2006 | Heath et al. |
| 2006/0267560 A1 | 11/2006 | Rajda et al. |
| 2006/0271244 A1 | 11/2006 | Cumming et al. |
| 2006/0271314 A1 | 11/2006 | Hayes |
| 2007/0055889 A1 | 3/2007 | Henneberry et al. |
| 2007/0058320 A1 | 3/2007 | Lee |
| 2007/0058634 A1 | 3/2007 | Gupta et al. |
| 2007/0067119 A1 | 3/2007 | Loewen et al. |
| 2007/0067121 A1 | 3/2007 | Przydatek et al. |
| 2007/0081597 A1 | 4/2007 | Disch et al. |
| 2007/0096765 A1 | 5/2007 | Kagan |
| 2007/0096942 A1 | 5/2007 | Kagan et al. |
| 2007/0112446 A1 | 5/2007 | Deveaux et al. |
| 2007/0114987 A1 | 5/2007 | Kagan |
| 2007/0136010 A1 | 6/2007 | Gunn et al. |
| 2007/0152058 A1 | 7/2007 | Yeakley et al. |
| 2007/0156915 A1 | 7/2007 | Neishi |
| 2007/0233323 A1 | 10/2007 | Wiemeyer et al. |
| 2008/0046205 A1 | 2/2008 | Gilbert et al. |
| 2008/0065335 A1 | 3/2008 | Doig et al. |
| 2008/0071482 A1 | 3/2008 | Zweigle et al. |
| 2008/0075194 A1 | 3/2008 | Ravi et al. |
| 2008/0086222 A1 | 4/2008 | Kagan |
| 2008/0091770 A1 | 4/2008 | Petras et al. |
| 2008/0127210 A1 | 5/2008 | Bosold et al. |
| 2008/0147334 A1 | 6/2008 | Kagan |
| 2008/0158008 A1 | 7/2008 | Kagan et al. |
| 2008/0172192 A1 | 7/2008 | Banhegyesi |
| 2008/0195794 A1 | 8/2008 | Banker |
| 2008/0215264 A1 | 9/2008 | Spanier et al. |
| 2008/0234957 A1 | 9/2008 | Banhegyesi et al. |
| 2008/0235355 A1 | 9/2008 | Spanier et al. |
| 2008/0238406 A1 | 10/2008 | Banhegyesi |
| 2008/0238713 A1 | 10/2008 | Banhegyesi et al. |
| 2008/0240140 A1 | 10/2008 | Dabagh et al. |
| 2008/0252481 A1 | 10/2008 | Vacar et al. |
| 2008/0255782 A1 | 10/2008 | Bilac et al. |
| 2009/0012728 A1 | 1/2009 | Spanier et al. |
| 2009/0066528 A1 | 3/2009 | Bickel et al. |
| 2009/0072813 A1 | 3/2009 | Banhegyesi |
| 2009/0096654 A1 | 4/2009 | Zhu et al. |
| 2009/0172455 A1 | 7/2009 | Pind |
| 2009/0228224 A1 | 9/2009 | Spanier et al. |
| 2009/0247146 A1 | 10/2009 | Wesby |
| 2009/0265124 A1 | 10/2009 | Kagan |
| 2010/0054276 A1 | 3/2010 | Wang et al. |
| 2010/0076616 A1 | 3/2010 | Kagan |
| 2010/0082844 A1 | 4/2010 | Stoupis et al. |
| 2010/0153036 A1 | 6/2010 | Elwarry et al. |
| 2010/0169876 A1 | 7/2010 | Mann |
| 2010/0324845 A1 | 12/2010 | Spanier et al. |
| 2011/0040809 A1 | 2/2011 | Spanier et al. |
| 2011/0119673 A1 | 5/2011 | Bloch et al. |
| 2011/0153697 A1 | 6/2011 | Nickolov et al. |
| 2011/0158244 A1 | 6/2011 | Long et al. |
| 2011/0260710 A1 | 10/2011 | Zhu et al. |
| 2011/0270551 A1 | 11/2011 | Kagan et al. |
| 2012/0025807 A1 | 2/2012 | Banhegyesi |
| 2012/0131100 A1 | 5/2012 | Olst et al. |
| 2012/0209057 A1 | 8/2012 | Siess et al. |
| 2012/0209552 A1 | 8/2012 | Spanier et al. |
| 2012/0209557 A1 | 8/2012 | Crandall et al. |
| 2013/0019042 A1 | 1/2013 | Ertugay et al. |
| 2013/0154833 A1 | 6/2013 | Kiss et al. |
| 2013/0158918 A1 | 6/2013 | Spanier et al. |
| 2014/0180613 A1 | 6/2014 | Banhegyesi et al. |
| 2014/0222357 A1 | 8/2014 | Spanier et al. |
| 2015/0019148 A1 | 1/2015 | Spanier et al. |
| 2015/0172226 A1 | 6/2015 | Borshteen et al. |
| 2017/0046458 A1 | 2/2017 | Meagher et al. |

FOREIGN PATENT DOCUMENTS

| | | |
|---|---|---|
| WO | 9854583 A1 | 12/1998 |
| WO | 0155733 A1 | 8/2001 |
| WO | 2005059572 A1 | 6/2005 |

OTHER PUBLICATIONS

International Standard IEC-61000-4-7, Second Edition; "Electromagnetic compatibility (EMC)-Part4-7:Testing and measurement techniques"; Copyright Commission Electrotechnique Commission 2002; Geneva, Switzerland; pp. 1-80.

ION Technology, 7500 ION 7600 ION High Visibility Energy & Power Quality Compliance Meters, Power Measurement, specification, pp. 1-8, revision date Nov. 30, 2000.

International Standard IEC-687, Second Edition; "Alternating current static watt-hours meters for active energy" Copyright Commission Electrotechnique Commission 1992; Geneva, Switzerland; pp. 1-36.

"muNet Demonstrates End-toEnd IP-Based Energy Management System at DistribuTECH," pp. 1-2 at http://www.munet.com/muNetNewPressReleases.sub.-0205001.htm, May 24, 2001.

"muNet's WebGate IRIS Deployed for Utility Trials Across US", pp. 1-2 at http://www.munet.com/muNetNewPressReleases121300.htm.

"muNet's WebGate System Finds a Home on the Internet," pp. 1-2 at http://www.munet.com/muNetNewPressReleases031899.htm, May 24, 2001.

"Power Quality—A guide to voltage fluctuation and light flicker"; BChydro Power Smart, Vancouver, B.C., Canada Dated Mar. 2005; pp. 1-12.

"Webgate Icis (Internet Commercial Information System)", pp. 1 at http://www.munet.com/munetproductsicisindex.htm, "Products (WebGate ICIS Internet AMR now)," pp. 1-2 at http://www.munet.com/munetproductsicis.htm, Products (Webgate ICIS Control Cenetr Software), pp. 1-2 at http://222.munet.com/munetproductsicisSpec.htm, May 24, 2001.

"Webgate Iris (Internet Residential Information System )"; http://www.munet.com/munetproducts.irisindex.html "Products," pp. 1-3; http://www.munet.com/munetproductsiris.html "Preliminary Specification" pp. 1-2; http://www.munet.com/munetproductsiris.sub.-Spec.html, May 24, 2001.

3720 ACM, 3-phase Power Instruction Package, Power Measurement, specification, 8 pages, revision date Dec. 16, 1998.

(56) References Cited

OTHER PUBLICATIONS

3720 ACM, Installation & Operation Manual, Power Measurement, 67 pages, revision date Apr. 4, 2000.
6200 ION, Installation & Basic Setup Instructions, (c)Power Measurement Ltd., Revision Date Apr. 25, 2001, 50 pages.
8400 ION/8500 ION Instruction Leaflet, Power Measurement, pp. 1-8, Oct. 1999.
8500 ION Technical Documentation, 8500 ION and 8500 ION-PQ Advanced Intelligent Billing Meters, specification, Power Measurement, revision date Apr. 15, 1999.
Braden, R (editor), "Requirements for Internet Hosts-Application and Support", RFC 1123, pp. 1-97, Oct. 1989.
Brochure, Sentinel TM Electronic "Multimeasurement Meter," Schlumberger, Mar., 2001, 4 pages.
Cerf et al., A Protocol for Packet Network Intercommunication, IEEE Trans on Comms, vol. Com-22, No. 5, May 1974, 13 pp. (Year: 1974).
Communicator EXT 3.0 User Manual Revision 1.32, Electro Industries/Gauge Tech, 558 pages, Aug. 27, 2007.
Deutsch, P., Emtage, A., and Marine, A., "How to Use Anonymous 1-1P", RFC1635, pp. 1-13, May 1994.
Electro Industries/Gauge Tech DM Series—specification brochure, "DMMS 425 Low-Cost Multifunction Power Monitoring Outperforms All Others in its Class", 4 pages.
Engage Network, Inc., "Internet Protocol Card for Revenue Meters", http://www.engagenet.com. Link present as of Mar. 2000 on http://web.archive.org/web/20010306005433/www.engagenet.com/content/produ- cts.shtml.
Futura+Series, "Advanced Power Monitoring and Analysis for the 21st Century", Electro Industries/Gauge Tech, specification, 8 pages, Apr. 13, 2000.
http://www.landisgyr.us/Landis_Gyr/Meters/2510_socket_meter.asp, Apr. 18, 2005, 25 pages.
Hubbert, "What is flat file?", WhatIs.com, http://searchsqlserver.techtarget.com/definition/flat-file, Jul. 2006, 1 pp
IEC 61000-4-15: Electromagnetic compatibility (EMC) Part 4: Testing and measuring techniques, Section 15: Flickermeter-Functional and design specifications; CENELEC-European Committee for Electrotechnical Standardization; pp. 1-25; Apr. 1998.
IEEE Std 1159-1995; IEEE Recommended Practice for monitoring Electric Power Quality; Copyright the Institute of Electrical and Electronics Engineers, Inc. 1995; New York, NY; pp. 1-76.
IEEE Std 519-1992; IEEE Recommended Practices and Requirements for Harmonic Control in Electrical Power Systems; Copyright the Institute of Electrical and Electronics Engineers, Inc. 1993; New York, NY; pp. 1-101.
International Standard IEC-1180-1; "High-voltage test techniques for low-voltage equipment"; Copyright Commission Electrotechnique Commission 1992; Geneva, Switzerland; pp. 1-62.
International Standard IEC-61000-2-4, Second Edition; "Electromagnetic compatibility (EMC)—Part 2-4:Environment-Compatibility levels in industrial plants for low-frequency conducted disturbances"; Copyright Commission Electrotechnique Commission 2002; GenevaSwitzerland; pp. 1-84.
International Standard IEC-61000-4-30, First Edition; "Electromagnetic compatibility (EMC)—Part 4-30:Testing and measurement techniques—Power quality measurement methods"; Copyright Commission Electrotechnique Commission 2003; Geneva, Switzerland; pp. 1-98.
ION 7550/ION7650 User Guide Power Measurement—Revision Date Aug. 31, 2004.
ION Technology 7700 ION 3-Phase Power Meter, Analyzer and Controller, Power Measurement, specification, pp. 1-10, revision date Dec. 8, 1998.
ION Technology 7700 ION Installation & Operation Manual, Power Measurement, revision date Nov. 20, 1996.
ION Technology 8500 ION. 8400 ION Advanced Socket-Mount Meter, specification, Power Measurement, pp. 1-12, revision date Dec. 3, 1999.
ON Technology, 7500 ION High Visibility 3-Phase Energy & Power Quality Meter, Power Measurement, specification, pp. 1-8, revision date Mar. 21, 2000.
ION(R) Technology, Meter Shop User's Guide, (C)Power Measurement Ltd., Revision DAte May 10, 2001, 48 pages.
ION7550/ion7650 PowerLogic power-monitoring units, Technical data sheets, pp. 1-12, Copyright 2006 Schneider Electric.
Manual, "3300 ACM, Economical Digital Power Meter/Transducer—Installation and Operation Manual, Power Measurement, Ltd.", 1999, pp. 79.
Multi-port Communication Card (MPCC), Multi-Port Ethernet Communications Card (MPE), Installation & Configuration Instructions, Power Measurement, pp. 1-9, revision date Jul. 25, 1997.
Nagura et al., "Correction method for a single chip power meter", May 10-12, 1994, IEEE, 1994 IEEE Instrumentation and Measurement Technology Conference, 1994. ITMC/94.
Nexus 1250 Installation and Operation Manual Revision 1.20, Electro Industries/Gauge Tech, 50 pages, Nov. 8, 2000.
Nexus 1250, Precision Power Meter & Data Acquisition Node, Accumeasure Technology, Electro Industries/Gauge Tech, specification, 16 pages, Nov. 1999.
Nexus 1250/1252 Installation and Operation Manual Revision 1.31, Electro Industries/Gauge Tech, 146 pages, Jan. 212010.
Nexus 1500 Installation and Operation Manual Revision 1.03, Electro Industries/Gauge Tech, 124 pages, Jan. 42010.
Performance Power Meter & Data Acquisition Node, Electro Industries/Gauge Tech, Nexus 1250 specification, 8 pages, Dec. 14, 2000.
Postel, J.B., and Reynolds, J.K. "File Transfer Protocol (FTP)", RFC959, pp. 1-66, Oct. 1985.
Power Platform 4300 Multi-DAQ TASKCard Operator's Manual; Dranetz-BMI, Original Issue—Jul. 2002, pp. 203.
Power Platform PP1 &PP1E TASKCard-lnrush Operator's Manual; Dranetz-BMI, Revision A—Apr. 15, 1997, pp. 231.
PowerLogic Series 4000 Circuit Monitors, pp. 1-4; Document #3020HO0601; Jan. 2006.
Ramboz, J.D. And Petersons, O., Nist Measurement Services: A Calibration Service for Current Transformers, U.S. Dept, of Commerce, National Institute of Standards and Tech., U.S. Gov. PMtg. Ofc., Jun. 1991.
Series 5500 InfoNode User's Gide; Dranetz-BMI, Edison, NJ; Copywright 1999, 2002,2004; pp. 1-220.
Speirs, "What is binary file?", WhatIs.com, http://whatis.techtarget.com/definition/binary-file, Apr. 2005,1 pp.
The Dranetz Field Handbook for Power quality Analysis; Dranetz Technologies Incorporated, Edison, NJ; Copyright 1991; pp. 1-271.
User's Installation & Operation and User's Programming Manual The Futura Series, Electro Industries, pp. 1-64, Copyright 1995.
Webopedia, https://web.archive.org/web/20021015112112/http://www.webopedia.com/TERM/F/flat_file_system.html, 2 pp., Oct. 15, 2002.
Xu Hong, Wang Jianhua, "An Extendable Data Engine based on OPC Specification", Computer Standards & Interfaces 26 (2004) 515-525; Dec. 5, 2003.
Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.

* cited by examiner

ON-LINE WEB ACCESSED ENERGY METER

PRIORITY

This application is a continuation application of U.S. application Ser. No. 14/093,644, filed Dec. 2, 2013, which is a continuation application of U.S. application Ser. No. 13/209,896, filed Aug. 15, 2011, now U.S. Pat. No. 8,599,036, which is a continuation application of U.S. application Ser. No. 11/998,920, filed Dec. 3, 2007, now U.S. Pat. No. 7,999,696, which is a continuation application of U.S. application Ser. No. 10/969,706, filed Oct. 20, 2004, now U.S. Pat. No. 7,304,586, entitled "ON-LINE WEB ACCESSED ENERGY METER", the contents of which are hereby incorporated by reference in their entirety.

BACKGROUND OF THE INVENTION

1. Field of the Invention

The present invention relates to utility revenue meters for measuring usage and quality of electrical power in an electrical power distribution network. In particular, the present invention relates to utility revenue meters that are connected to the Internet via wireless means.

2. Discussion of the Related Art

With proliferation of electrically powered devices and systems, there is an increasing need to accurately and precisely measure and monitor the quality of the electrical power supplying these devices and systems. Electric utility companies ("utilities") track electric usage by customers by using electrical energy meters. These meters track the amount of energy consumed at a particular location. These locations range from power substations, to commercial businesses, to residential homes. The electric utility companies use the energy meters to charge customers for their power consumption, i.e. revenue metering.

A popular type of energy meter is the socket-type energy meter. As its name implies, the meter itself plugs into a socket for easy installation, removal, and replacement. Other meter installations include panel mounted, switchboard mounted, and circuit breaker mounted. Typically the energy meter connects between utility power lines supplying electricity and a usage point, namely a residence or commercial place of business. Though not typical, an energy meter may also be placed at a point within the utility's power grid to monitor power flowing through that point for distribution, power loss, or capacity monitoring. Also, energy meters that handle sub-metering functions can be used to monitor internal customer usage.

Traditionally, energy meters used mechanical means to track the amount of consumed power. The inductive spinning disk energy meter is still commonly used. The spinning disk drives mechanical counters that track the power consumption information. Newer to the market are electronic energy meters based on solid-state microprocessor applications. Electronic meters have replaced the older mechanical meters, and utilize digital sampling of the voltage and current waveforms to generate power consumption information. In addition to monitoring power consumption, electronic meters can also monitor and calculate power quality, that is, voltage, current, real power, reactive power, apparent power, etc. These power quality measurements and calculations are displayed on an output display device on the meter.

While electrical utility companies currently use devices to measure the amount of electrical power used by both residential and commercial facilities and the quality of electrical power in an electrical power distribution network, these devices generally do not allow for readings to be made automatically via some remote means. The meter readings are collected in the same manner they were collected in the past, a person reads and reports the information displayed on the meter.

In more recent developments, limited power consumption information can be transmitted from the energy meter to the utility through the use of telephone communications circuitry contained either within or external to the meter. These developments are advantageous to the utility company in that they reduce the need for employees being dispatched to the remote locations to collect the power consumption information. A standard modem receives raw power consumption information from the energy meter and transmits the information to the utility company via telephone lines.

FIG. 1 illustrates a house or an institution 10 having a revenue meter 12 connected to a modem 14. The modem 14 is, in turn, connected to a telephone line 16. In the house or an institution 10, the telephone line 16 may be a dedicated line, i.e., only the modem 14 is connected to it, or a shared line, for example, with one or more telephones 18 connected to the same line 16 via a telephone jack 17. The telephone line 16 is connected to the telephone infrastructure or grid 28 being managed by a telephone company 26. Similarly, on the utility side, the utility company or a department entrusted to receive meter readings 20 includes at least one computer 22 connected to a modem 24, which is connected to the telephone line 16.

While this represents an improvement over past techniques, this method has proven to be costly and unreliable, as there is a need for dedicated telephone line connection and line maintenance, which is expensive. When equipment malfunctions an employee must be dispatched to determine the reason for the malfunction and then a specialist must be sent in to fix it. Therefore, there exists a need for a device, which can accurately, inexpensively, and timely provide measurements, e.g., power consumption information, recorded by a common energy or energy meter.

SUMMARY OF THE INVENTION

It is therefore an object of the present invention to provide an electronic energy meter that can deliver power consumption information readings from residential and commercial facilities to electrical utility companies.

It is another object of the present invention to provide an electronic energy meter that provides power consumption information to the electrical utility companies automatically via a remote means.

It is yet another object of the present invention to provide an electronic energy meter that provides power consumption information to the electrical utility companies without involvement of human meter readers and installation of modems and telephone lines.

The present invention provides an electric energy meter for providing real time revenue metering using wireless or cell phone technology. The present invention describes an electrical metering system capable of performing multiple metering functions, collecting data, and wirelessly provides the collected metering data to a utility operator is disclosed. The electrical metering system comprising at least one computing device for initiating a request for data; a first modem for connecting the computing device to an infrastructure; a wireless embedded modem for wirelessly connecting an electric meter to an infrastructure, wherein the wireless electric modem receives a request from the computing device and wirelessly transmits the metering data to the computing device thereby initiating the request.

The present application describes three infrastructure variations herein below. However, additional combinations and variations of the described infrastructure will be understood by those skilled in the art. The invention describes establishing communication between the embedded wireless modem and the computing device over the following infrastructures:

1. The infrastructure comprises a telephone infrastructure including telephone landlines operated by at least one telephone company and a cell phone infrastructure including cell phone relay stations operated by at least one cell service provider. The embedded wireless modem utilizing industry standard interface protocols used within the cell phone industry to communicate with the computing device.

2. The infrastructure comprises a wide area network, e.g., the Internet. The embedded wireless modem utilizing industry standard interface protocols, for example, 802.11a and 802.11b, to communicate with the computing device.

3. The infrastructure further comprises the wide area network and a carrier network infrastructure including a broadcasting means operated by at least one carrier network provider. The embedded wireless modem utilizing industry standard interface protocols selected from General Packet Radio Service (GPRS), Code Division Multiple Access (CDMA), and Wideband Code Division Multiple Access (WCDMA) to communicate with the computing device.

BRIEF DESCRIPTION OF THE DRAWINGS

The present invention is further explained by way of example and with reference to the accompanying drawings, wherein.

DETAILED DESCRIPTION OF THE PREFERRED EMBODIMENTS

The present invention provides an electric energy meter for providing real time revenue metering using wireless or cell phone technology to deliver information to a computing device on a network, e.g., an Internet website, managed by an electrical utility company or its affiliates. The operation of the electric energy meter of the present invention is described in a co-owned U.S. Pat. No. 6,751,563, titled "Electronic Energy meter", the contents of which are incorporated herein by reference.

Figure 5:
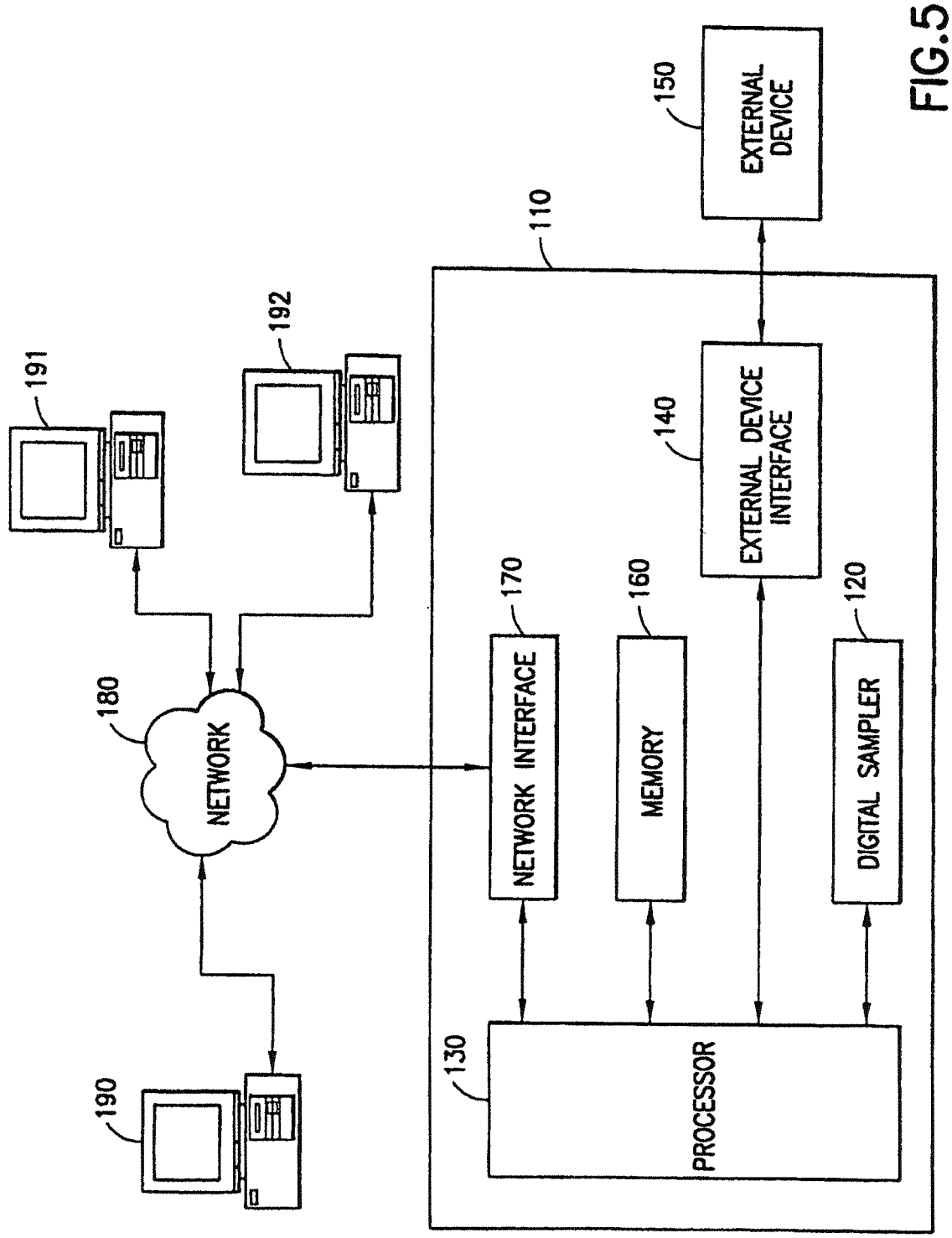
FIG. 5 is a block diagram of a power quality and revenue meter according to an embodiment of the present invention.

Portions of U.S. Pat. No. 6,751,563 will be reproduced here. FIG. 5 is a block diagram of a web server power quality and revenue meter according to an embodiment of the present invention. Shown in FIG. 5 are power quality and revenue meter (meter) 110. The meter is connected to monitor electric distribution power lines (not shown), to monitor voltage and current at the point of connection. Included therein is digital sampler 120 for digitally sampling the voltage and current of the power being supplied to a customer or monitored at the point of the series connection in the power grid. Digital sampler 120 digitally samples the voltage and current. The digital samples are then forwarded to processor 130 for processing. Also connected to processor 130 is external device interface 140 for providing an interface for external devices 150 to connect to meter 110. These external devices might include other power meters, substation control circuitry, on/off switches, etc. Processor 130 receives data packets from digital sampler 120 and external devices 150, and processes the data packets according to user defined or predefined requirements. A memory 160 is connected to processor 130 for storing data packets and program algorithms, and to assist in processing functions of processor 130. These processing functions include the power quality data and revenue calculations, as well as formatting data into different protocols which will be described later in detail. Processor 130 provides processed data to network 180 through network interface 170. Network 180 can be the Internet, the World Wide Web (WWW), an intranet, a wide area network (WAN), or local area network (LAN), among others. In the preferred embodiment, the network interface converts the data to an Ethernet TCP/IP format. The use of the Ethernet TCP/IP format allows multiple users to access the power meter simultaneously. In a like fashion, network interface 170 might be comprised of a modem, cable connection, or other devices that provide formatting functions. Computers 190-192 are shown connected to network 180.

A web server program (web server) is contained in memory 160, and accessed through network interface 170. The web server provides real time data through any known web server interface format. For example, popular web server interface formats consist of HTML and XML formats. The actual format of the programming language used is not essential to the present invention, in that any web server format can be incorporated herein. The web server provides a user friendly interface for the user to interact with the meter 110. The user can have various access levels to enter limits for e-mail alarms. Additionally, the user can be provided the data in a multiple of formats including raw data, bar graph, charts, etc. The currently used HTML or XML programming languages provide for easy programming and user friendly user interfaces.

The operation of the device of FIG. 5 will now be described. Digital sampler 120 samples the voltage and current at and flowing through the point of connection, or sampling point. The voltage and current readings, in the form of data packets, are forwarded to processor 130 where they undergo various power calculations. Processor 130 calculates, for example, instantaneous voltage and current, real power, reactive power, and apparent power. The processing algorithms can be preprogrammed into memory 160, uploaded by an end user, or performed at the end-user's location. The calculations performed by processor 130 are not meant to be all inclusive, as the processor can be programmed to provide any number of preprogrammed or user defined calculations. In addition to performing the calculations, processor 130 sends the packet data to memory 160 to be stored for future access. As digital sampler 120 is sampling the voltage and current at the sampling point, external device 150 can be feeding parallel information to processor 130 through external device interface 140. This external device packet data would be processed and stored in a similar manner as the digital sampler packet data. Processor 130 then formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data is now available to users at computers 190-192 through network 180, that connects to meter 10 at the network interface 170.

In the preferred embodiment of the present invention, network interface 170 is an Ethernet interface that supports, for example, 100 base-T or 10 base-T communications. This type of network interface can send and receive data packets between WAN connections and/or LAN connections and the meter 110. This type of network interface allows for situations, for example, where the web server may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 6:
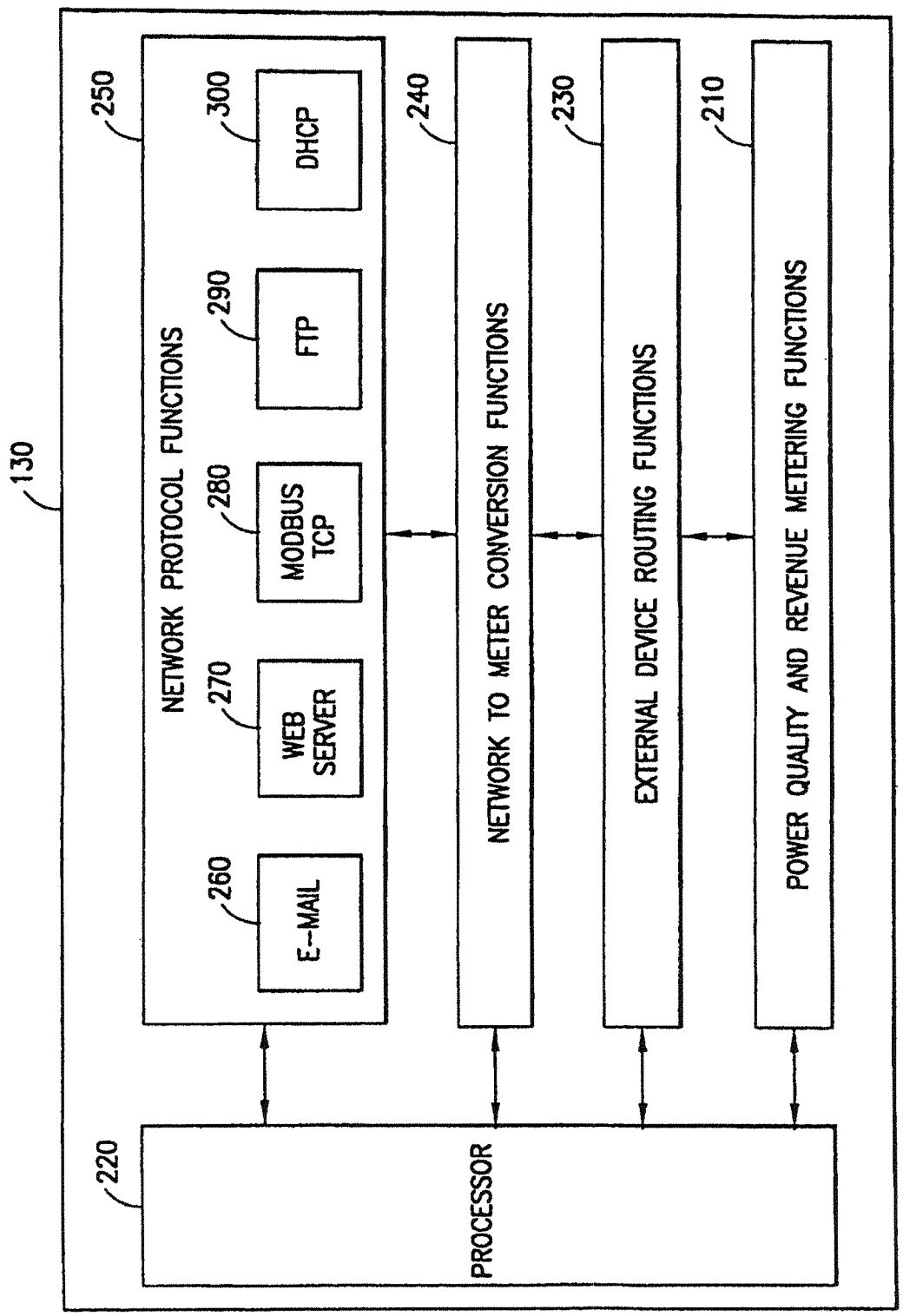
FIG. 6 is a functional block diagram of the processor functions of a power quality and revenue meter system shown in FIG. 5 according to an embodiment of the present invention.

FIG. 6 is a functional block diagram of processor 130 of the web server power quality and revenue meter system according to the embodiment of the present invention. FIG. 6 illustrates the functional processing structure of processor 130. Processor 130 is shown containing four main processing functions. Processing 220 can be realized in various memory configurations, and are not limited to any one configuration. The functions shown are illustrative and not meant to be inclusive of all possible functions performed by processor 130. Power Quality and Revenue Metering functions (metering functions) 210 consists of a complete set of functions which are needed for power quality and revenue metering. Packet data collected by digital sampler 120 is transmitted to processor 130. Processor 130 calculates, for example, power reactive power, apparent power, and power factor. The metering function 210 responds to commands via the network or other interfaces supported by the meter. External Device Routing Functions 230 handle the interfacing between the external device 150 and meter 110. Raw data from external device 150 is fed into meter 110. The external device 150 is assigned a particular address. If more than one external device is connected to meter 110, each device will be assigned a unique particular address.

Referring again to FIG. 5, network interface 170 can support, for example, either 100 base-T or 10 base-T communications, and receives and sends data packet between a wide area network (WAN) connection and/or local area network (LAN) connection and the meter. The Network Protocol Functions of meter 110 are executed by processor 130 which executes multiple networking tasks that are running concurrently. As shown in FIG. 6, these include, but are not limited to, the following network tasks included in network protocol functions 250: e-mail 260, web server 270, Modbus TCP 280, FTP 290, and DHCP 300. The e-mail 260 network protocol function can be utilized to send e-mail messages via the network 180 to a user to, for example, notify the user of an emergency situation or if the power consumption reaches a user-set or pre-set high level threshold.

As the processor receives packets of data it identifies the network processing necessary for the packet by the port number associated with the packet. The processor allocates the packet to a task as a function of the port number. Since each task is running independently the meter 110 can accept different types of requests concurrently and process them transparently from each other. For example, the web server may be accessed by one user while another user is communicating via Modbus TCP and at the same time a third user may download a log file via FTP.

The Network to Meter Protocol Conversion Function 240 is used to format and protocol convert the different network protocol messages to a common format understood by the other functional sections of meter 110. After the basic network processing of the packet of data, any "commands" or data which are to be passed to other functional sections of meter 110 are formatted and protocol converted to a common format for processing by the Network to Meter Protocol Conversion Function 240. Similarly, commands or data coming from the meter for transfer over the network are pre-processed by this function into the proper format before being sent to the appropriate network task for transmission over the network. In addition this function first protocol converts and then routes data and commands between the meter and external devices.

Numerous types of wireless Ethernet connections can be used to perform the objects of the present invention. These types can be classified in terms of the type of a connection to the network and the configuration and capability of the utility revenue meter. In general, the proposed implementation can be used on any network that includes wireless modems. The following are some examples of proposed configurations.

Dial-Up Connection

Figure 1:
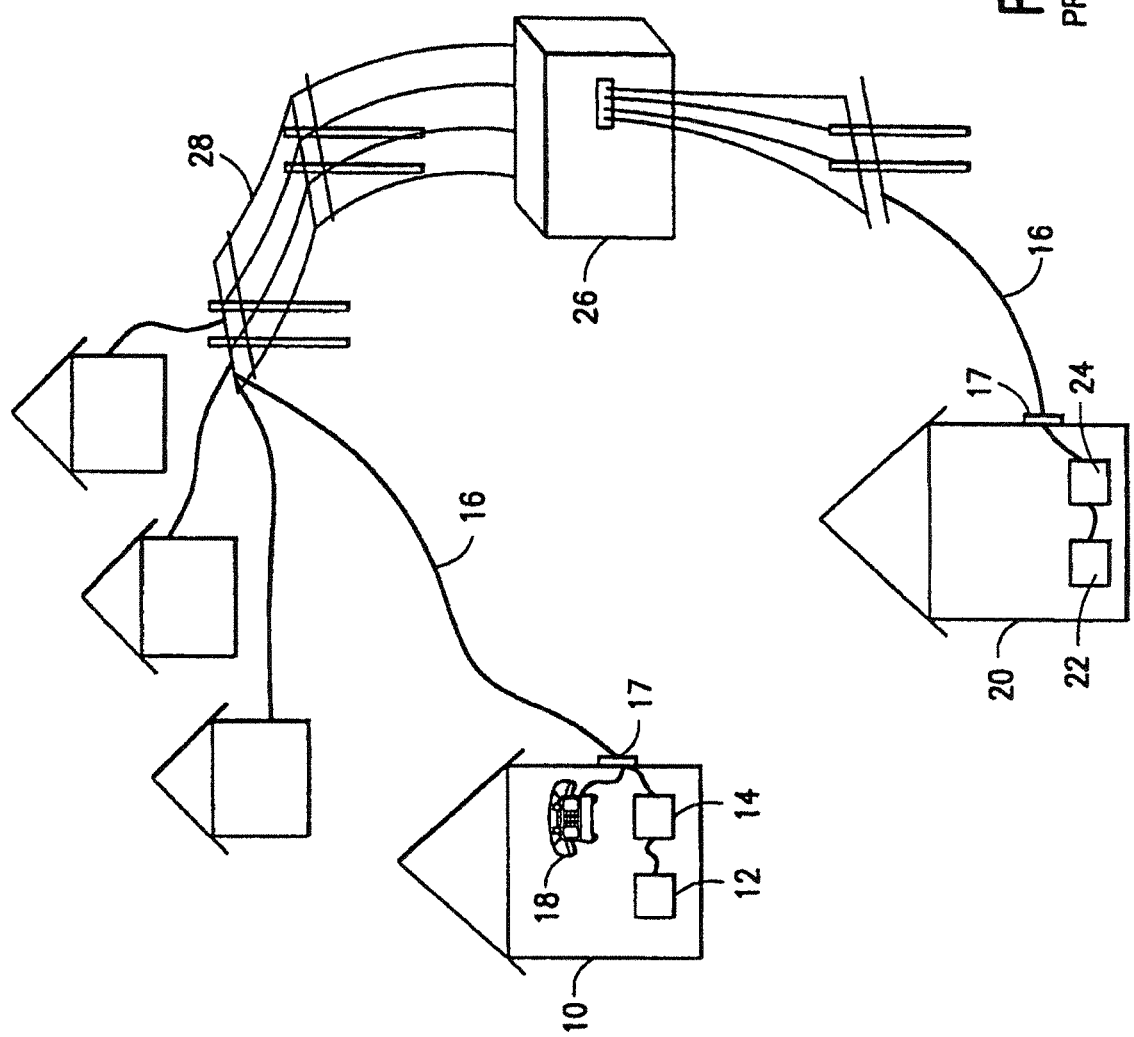
FIG. 1 is a diagram of interconnectivity between an energy meter and a utility for the purpose of collecting power usage data according to prior art.
Figure 2:
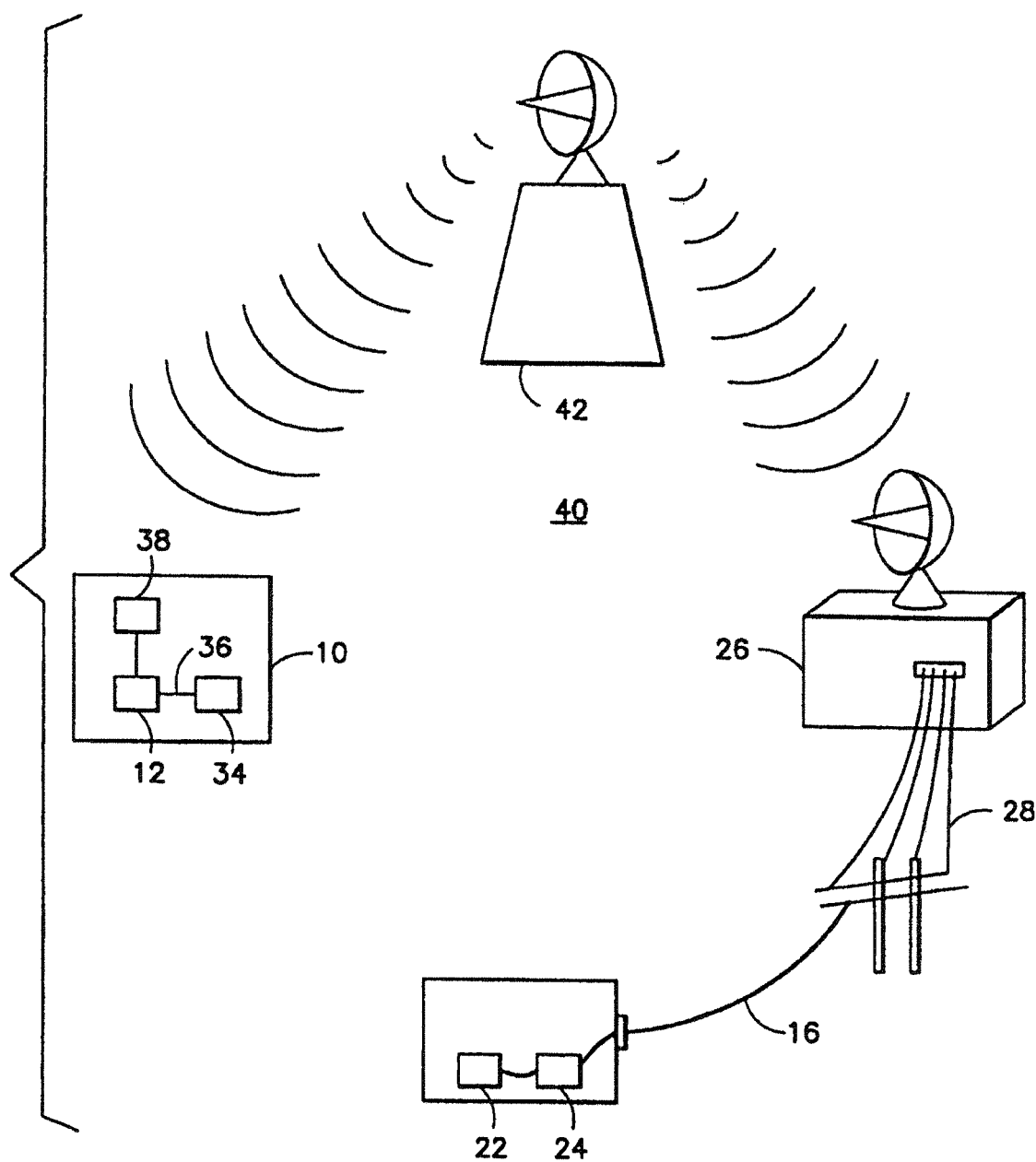
FIG. 2 is a diagram of interconnectivity between an energy meter and a utility for the purpose of collecting power usage data, using the telephone and a cell phone infrastructures, according to the present invention.

FIG. 2 illustrates a computing device 22, e.g., a computer or a hand held wireless device that may be used to retrieve information form a revenue meter 12. A revenue meter 12 is located within or outside a house or an institution 10 for metering utility provided resources, e.g., electrical power. A connection between the computing device 22 and the revenue meter 12 may be established via a dial-up using wired lines 28, such as a telephone infrastructure and wireless cell technology. A telephone infrastructure or grid 28, managed by a telephone company 26 may be used together with the wireless grid infrastructure 40 including Cell Relay stations 42 managed by a cell phone service provider. It is noted that the telephone infrastructure or grid 28 may be discarded where the computing device 22 has direct access to the wireless grid infrastructure 40.

The computing device 22 may be located anywhere the telephone and cell infrastructures 26 and 40 reaches. This may be on the premises of a utility company itself or at any department or agency entrusted with receiving meter readings. The connection between the computing device 22 and the revenue meter 12 may be established via a dial-up process using a wireless modem 34 to respond to a signal from the computing device 22 relayed by a cell relay station 42.

The wireless embedded modem 34 can communicate with the revenue meter via hard wired communication means 36, such as, a serial connection, the Ethernet, a universal serial bus (USB), and a faster version of USB, USB2, or using wireless means, for example, 802.11 and similar protocols. The meter peripheral device's 38 communicates with the revenue meter 12 via industry standard communication protocols, such as, Modbus remote terminal unit (RTU) from the Modicon Inc., DNP etc., so that the meter peripheral device 38 can act as a server for any revenue meters 12 utilizing industry standard interfaces and protocols. The peripheral device 38 presents the collected meter readings and data to the wireless modem 34 to be forwarded to the computing device 22 using a browser program.

The revenue meter 12 or a peripheral device 38 attached to the revenue meter manage the wireless modem 34, e.g., controlling the modem's readiness for a dial-up session established by the computing device 22. Additionally, the revenue meter 12 or the peripheral device 38 may be accessed via the wireless modem 34 and used as a server for providing revenue meter's readings and other relevant data to the computing device 22. An interface program, e.g., a browser may be used on the revenue meter 12 or the peripheral device 38 to send and receive data.

In this mode, after the connection between the embedded wireless modem 34 and the computing device 22 is established, the revenue meter 32 or the meter peripheral device 38 control the embedded wireless modem 34 maintaining its readiness for a dial-up session. Such a session may be initiated by the computing device 42 at any time.

Wireless Packet Data Connection

Figure 3:
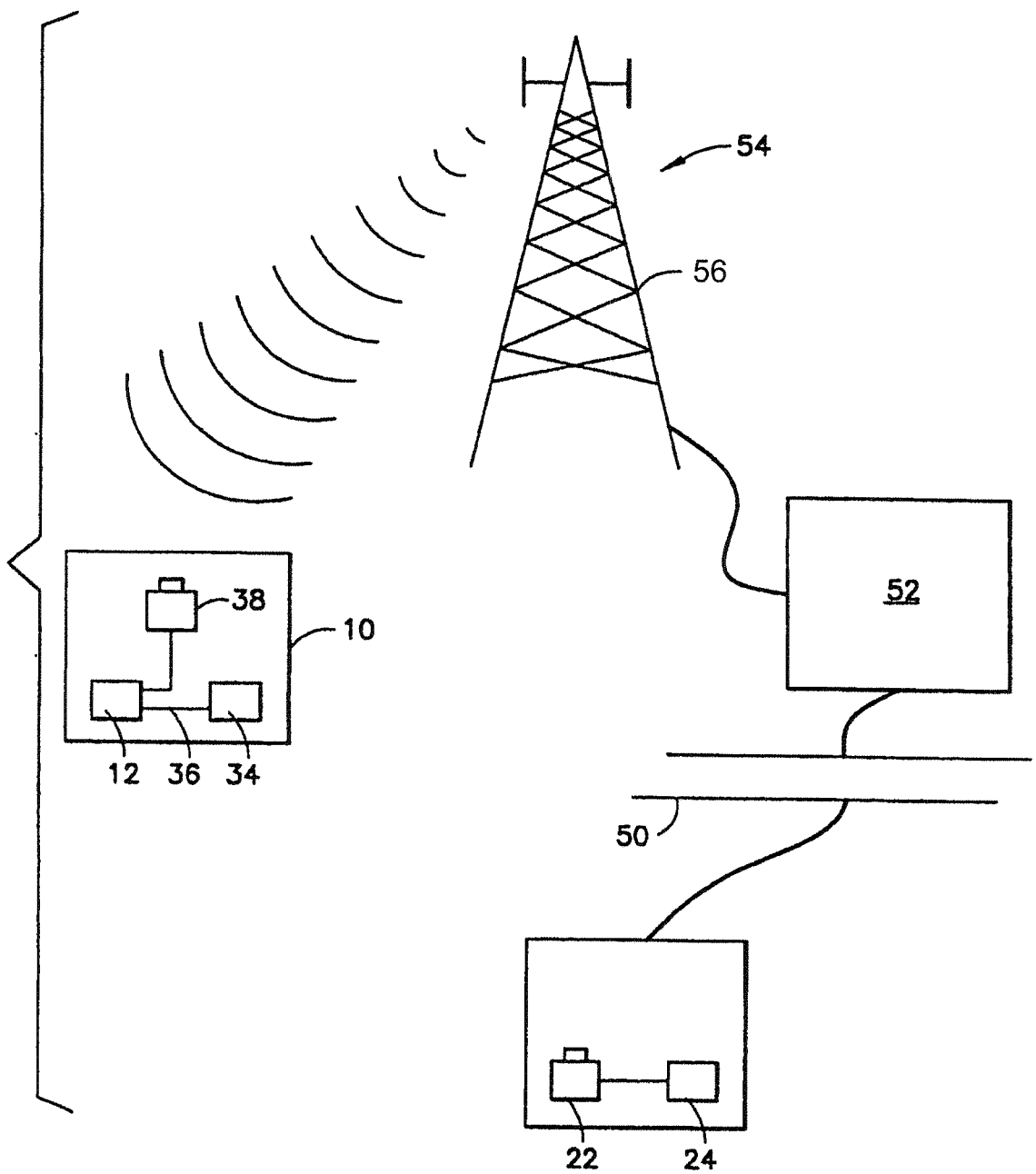
FIG. 3 is a diagram of interconnectivity between an energy meter and a utility for the purpose of collecting power usage data, using the Internet and a carrier network infrastructures, according to the present invention.

In another embodiment of the invention illustrated in FIG. 3, the wireless modem 34 communicates with the computing device 22 via a carrier network 54 using various protocols, e.g., a General Packet Radio Service (GPRS), Code Division Multiple Access (CDMA), Wideband Code Division Multiple Access (WCDMA) etc., to provide the revenue meter information collected by the revenue meter 12. In this embodiment, the carrier network 54 is utilized in conjunction with packet data networks, such as the Internet.

A connection between computing device 22, e.g., a computer or a hand held wireless device and the revenue meter 12 may be established via a carrier network 54. The computing device 22 uses a dial-up modem 24 or some other means to access an Internet service provider (ISP) and a common browser program, e.g., a Microsoft Explorer, to connect to the Internet 50, and through it to the carrier network 54. The dial-up modem 24 can be a digital subscriber line (DSL) modem or a cable modem and can connect to the Internet via the cable, satellite, or the telephone infrastructure, including hot spots located within appropriate distance from the modem 24. The modem 24 may be built into the computing device 22.

The carrier network 54 may include a carrier network provider facility 52, a broadcasting means 56, e.g., a broadcasting tower, a satellite, etc., and some means of access to the Internet 50. The computing device 22 may be located anywhere, the only requirement is that it has an ability and means to connect to the Internet 50. The computing device 22 may be located on the premises of a utility company itself or at any department or agency entrusted with receiving meter readings.

A request for information from the computing device 22 is forwarded over the Internet 50 to the carrier network provider facility 52, where the request is processed and transmitted via the broadcasting means 56 to the wireless embedded modem 34. The wireless embedded modem 34 can communicate with the revenue meter via hard wired communication means 36, such as, a serial connection, the Ethernet, a universal serial bus (USB), and a faster version of USB, USB2, or using wireless means, for example, 802.11 and similar protocols.

The revenue meter 12 or a peripheral device 38 attached to the revenue meter, manages the wireless modem 34, e.g., control the modem's readiness to send information to the computing device 22. Additionally, the revenue meter 12 or the peripheral device 38 may perform as a server for providing revenue meter's readings and other relevant data to the computing device 22. An interface program, e.g., a browser, may be used to send and receive data.

Hot Spots

Figure 4:
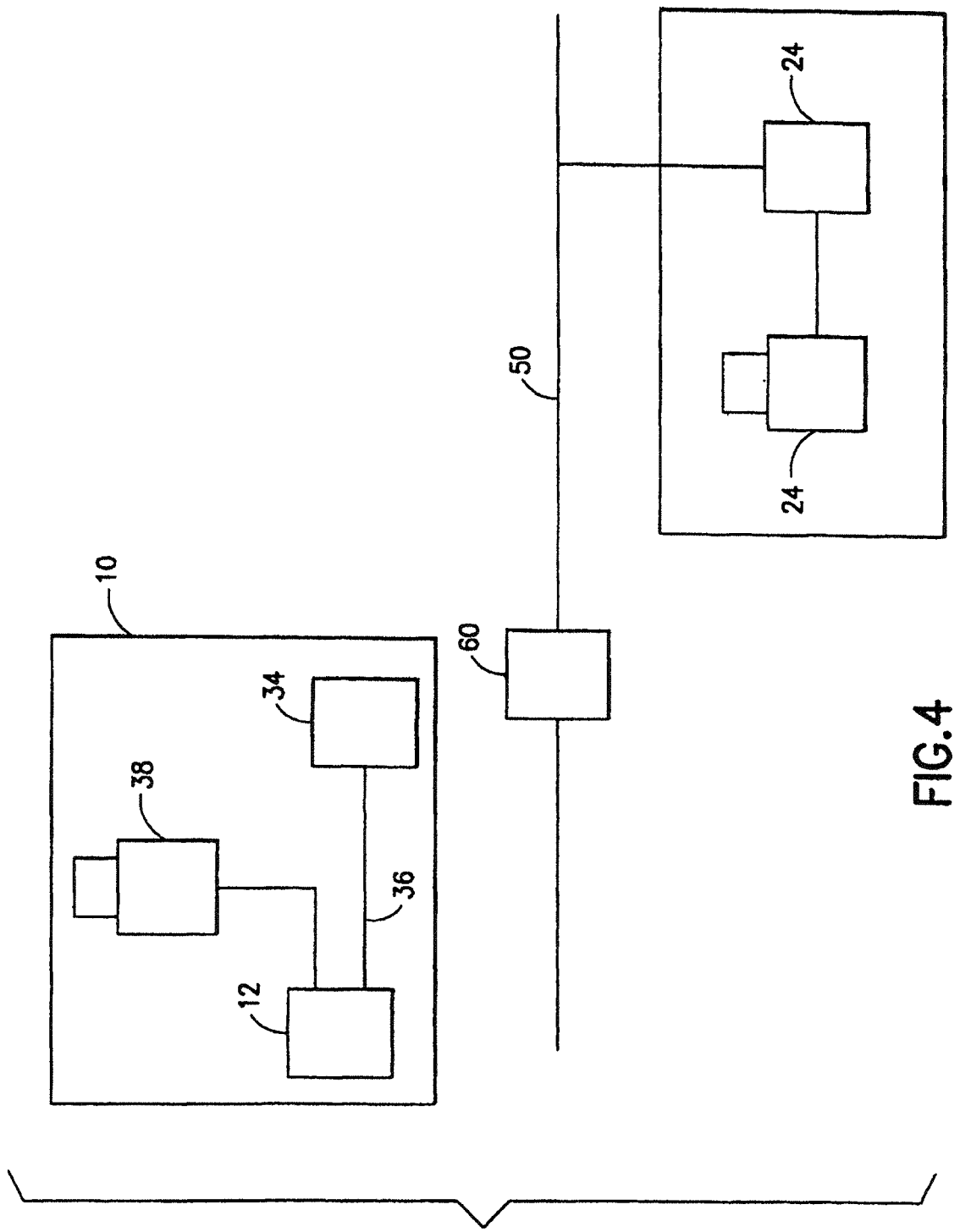
FIG. 4 is a diagram of interconnectivity between an energy meter and a utility for the purpose of collecting power usage data, using the Internet infrastructure, according to the present invention.

In another embodiment of the invention illustrated in FIG. 4, the wireless modem 34 communicates with the computing device 22 via the Internet 50 to provide information collected by the revenue meter 12. In this embodiment, the wireless modem 34 is accessed via a wireless access point (802.11a or b) called a hot spot 60, which covers a specific geographic boundary. The hot spots are usually set up for Internet access by devices with wireless connectivity. Hot spots can be located just about anywhere, and the maximum connectivity distance is being constantly improved.

Although the illustrative embodiments of the present disclosure have been described herein with reference to the accompanying drawings, it is to be understood that the disclosure is not limited to those precise embodiments, and that various other changes and modifications may be affected therein by one skilled in the art. That is, those skilled in the art will envision other modifications within the scope and spirit of the claims appended hereto.

What is claimed is:

1. An electrical metering device comprising:
   a digital sampler configured for sampling voltage and current waveforms;
   at least one processor configured to collect the sampled voltage and current waveforms and generate power consumption data from the sampled voltage and current waveforms, the at least one processor further comprises a network protocol converter that formats the collected and generated data into at least two network protocols; and
   a wireless network interface that provides the sampled voltage and current and generated power consumption data to a wide area network over a communication infrastructure via the at least one network protocol, the at least one network protocol including HTML, XML, Modbus TCP, RS-485 and FTP,
   wherein the wireless network interface enables access to the collected and generated data to at least two users simultaneously, each of the at least two users using a different network protocol.

2. The device of claim 1, wherein the communication infrastructure further includes a carrier network infrastructure coupled to the wide area network, the carrier network infrastructure including a broadcasting means operating at least one carrier network protocol.

3. The device of claim 1, wherein the wide area network operates on TCP/IP.

4. The device of claim 1, wherein the wide area network is the Internet.

5. The device of claim 1, wherein the wide area network is Ethernet-based.

6. The device of claim 5, wherein the wide area network uses Dynamic Host Configuration Protocol (DHCP) to assign an IP address to the wireless network interface.

7. The device of claim 1, further comprising a communication means for connecting the wireless network interface to the at least one processor, the communication means being selected from hard wired or wireless means.

8. The device of claim 7, wherein the hard wired means is selected from one of a serial connection, the Ethernet, and a universal serial bus (USB).

9. The device of claim 1, wherein the at least one processor utilizes metering protocols selected from Modbus remote terminal unit (RTU) and DNP to communicate to the wireless network interface.

10. The device of claim 1, further comprising an external device interface coupled to the at least one processor to receive data from at least one external metering device.

11. The device of claim 1, wherein the wireless network interface is further configured to operate on a cellular network protocol.

12. The device of claim 11, wherein the wireless network interface is further configured to operate on at least one of General Packet Radio Service (GPRS), Code Division Multiple Access (CDMA), and/or Wideband Code Division Multiple Access (WCDMA) to communicate.

13. The device of claim 1, wherein the electrical metering device is at least one of a socket-type meter, a panel mounted meter, a switchboard meter and/or a circuit breaker mounted meter.

14. The device of claim 1, further comprising a memory that stores a web server program, the web server program provides an interface for an external computing device to access the collected and generated data.

15. The device of claim 1, wherein each of the at least two users access the wireless network interface via an external computing device, the external computing device includes at least one of a desktop personal computer, a laptop computer, a cell phone, and/or a hand held computing device.

16. The device of claim 15, wherein the external computing device uses a web browsing program to initiate a request for data.

17. The device of claim 10, wherein the external device interface is further configured to be coupled to at least one of sub-station control circuitry and on/off switches.

18. The device of claim 14, wherein the external computing device uses a web browsing program to initiate a request for the collected and generated data.

* * * * *